United States Patent [19]

Yang

[11] Patent Number: 5,763,285

[45] Date of Patent: Jun. 9, 1998

[54] PROCESS FOR CONTROLLING GATE/ DRAIN OVERLAPPED LENGTH IN LIGHTLY-DOPED DRAIN (LDD) STRUCTURES

[75] Inventor: Jiuun-Jer Yang, Taipei Hsien, Taiwan

[73] Assignee: Winbond Electronics Corporation, Hsinchu, Taiwan

[21] Appl. No.: 662,775

[22] Filed: Jun. 10, 1996

[51] Int. Cl.$^6$ ................................. H01L 21/265
[52] U.S. Cl. ........................ 437/44; 437/40; 437/41
[58] Field of Search ....................... 437/40, 41, 44, 437/912

[56] References Cited

U.S. PATENT DOCUMENTS

| | | | |
|---|---|---|---|
| 5,272,100 | 12/1993 | Satoh et al. | 437/44 |
| 5,374,575 | 12/1994 | Kim et al. | 437/44 |
| 5,501,997 | 3/1996 | Lin et al. | 437/44 |
| 5,518,945 | 5/1996 | Bracchitta et al. | 437/44 |
| 5,650,342 | 7/1997 | Satoh et al. | 437/36 |

FOREIGN PATENT DOCUMENTS 59-201469  11/1984  Japan ....................... 29/578

OTHER PUBLICATIONS

F.-C. Hsu and H. R. Grinolds, "Structure-Enhanced MOSFET Degradation Due to Hot-Electron Injection," *IEEE Electron Device Letters*, vol. EDL-5, No. 3, pp. 71-74, Mar. 1984.

T.Y. Huang et al., "A New LDD Transistor with Inverse-T (ITLDD) Gate Structure," *IEEE Electron Device Letters*, vol. EDL-8, No. 4, pp. 151-153, Apr. 1987.

R. Izawa et al., "Impact of the Gate-Drain Overlapped Device (GOLD) For Deep Submicron VLSI," *IEEE Transactions on Electron Devices*, vol. 35, No. 12, pp. 2088-2093, Dec. 1988.

T. Hori, "¼-mm LATID (Large-Tilt-Angle Implanted Drain) Technology for 3.3-V Operation," *IEEE IEDM* 1989, pp. 777-780 month unknown.

J. E. Moon et al., "A New LDD Structure: Total Overlap with Polysilicon Spacer (TOPS)," *IEEE Electron Device Letters*, vol. 11, No. 5, pp. 221-223, May 1990.

D. S. Wen et al., "A Self-Aligned Inverse-T Gate Fully Overlapped LDD (FOLD) Device for Sub-Half Micron CMOS," *IEEE IEDM* 1989, pp. 765-768 month unknown.

Wolf et al, Silicon Processing for the VLSI Era, vol. 1: Process Technology, Lattice Press, pp. 188-191, 397-399, 1986.

*Primary Examiner*—John Niebling
*Assistant Examiner*—Michael S. Lebentritt
*Attorney, Agent, or Firm*—Meltzer, Lippe, Goldstein, Wolf & Schlissel, P.C.

[57] ABSTRACT

A process for forming a lightly-doped drain (LDD) structure in a MOSFET or other semiconductor device. A first polysilicon layer is deposited over a thin gate oxide layer formed on a substrate. The first polysilicon layer is etched to form a first gate region. The substrate is then doped adjacent the gate region to form a drain region having a relatively low impurity concentration. The first polysilicon gate region is removed and a second polysilicon layer is applied to the substrate. The second layer is etched to form a second gate region which will serve as the actual gate region for the MOSFET device. The drain region is then doped a second time to form an LDD structure in which a portion of the drain region underlying the second gate region remains lightly doped while another portion of the drain region exposed to the second doping becomes more heavily doped. The difference in length between the first and second gate regions is used to set the gate/drain overlapped length. The process may be used to form a fully-overlapped LDD structure or may include steps for forming an oxide spacer adjacent the second gate region to thereby produce a partially-overlapped LDD structure.

16 Claims, 2 Drawing Sheets

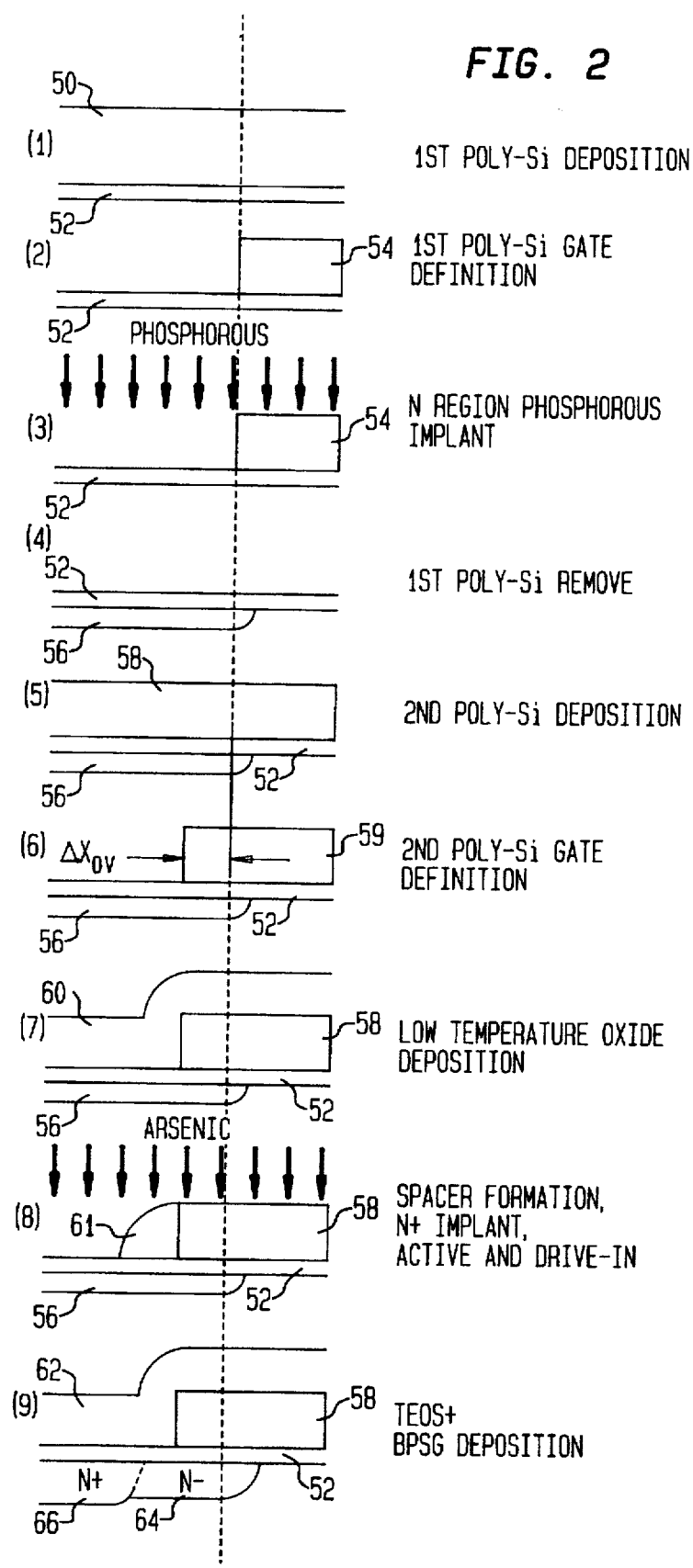

PROCESS FOR CONTROLLING GATE/ DRAIN OVERLAPPED LENGTH IN LIGHTLY-DOPED DRAIN (LDD) STRUCTURES

FIELD OF THE INVENTION

The present invention relates generally to semiconductor devices and more particularly to a process for controlling the gate/drain overlapped length in a semiconductor integrated circuit device which includes a lightly doped drain (LDD) structure.

BACKGROUND OF THE INVENTION

As sub-micron metal-oxide-semiconductor (MOS) device dimensions continue to decrease, the resulting increases in channel electric field strength can produce hot carrier effects which significantly degrade device performance. The hot carrier problem is described in greater detail in, for example, F. -C. Hsu and H. R. Grinolds, "Structure-Enhanced MOSFET Degradation Due to Hot-Electron Injection," IEEE Electron Device Letters, Vol. EDL-5, No. 3, pp. 71–74, March 1984. Overcoming the hot carrier problem has become a very important consideration in the design of sub-micron MOS elements. One approach which is used extensively in very large scale integrated (VLSI) device technology is referred to as the lightly doped drain (LDD) structure.

FIG. 1A illustrates a portion of a MOS field effect transistor (FET) 10. The MOSFET 10 includes an N+drain region 14 formed in a substrate 12. A gate 16 is formed of polysilicon or another suitable material overlying the substrate 12 and separated therefrom by a thin layer of gate oxide 18. An oxide sidewall spacer 20 is formed in a conventional manner adjacent one side of the gate 16. An N- lightly doped drain (LDD) region 22 is formed during a first impurity implantation step after the formation of the gate 16 and prior to the formation of the spacer 20. The N- LDD region formed by this first implantation step is self-aligned to the gate 16, and its final length is generally a function of a number of subsequent thermal cycles performed on the device as well as the width of the subsequently-formed oxide spacer 20. The first implantation step results in a drain region having a relatively low N- impurity concentration on the order of $10^{18} cm^{-3}$. The impurity concentration of the LDD region 22 thus results primarily from this first implantation step.

A second impurity implantation step is performed after formation of the oxide spacer 20. The gate 16 and spacer 20 block the implantation of additional impurities in the LDD region 22 while allowing implantation of additional impurities in the N+drain region 14. The second implantation step increases the impurity concentration of the region 14 to about $10^{20} cm^{-3}$ to $10^{21} cm^3$, while the LDD region remains lightly doped due to the presence of the gate 16 and spacer 20. The LDD structure illustrated in FIG. 1A is referred to as a partially-overlapped structure in that the gate 16 only partially overlaps the N- LDD region 22. The overlapped length $X_{ov}$ indicated in FIG. 1A corresponds to the length of the gate-LDD overlap. Although the gate 16 and spacer 20 define the LDD region 22 in the partially-overlapped structure, the final overlapped length $X_{ov}$ is primarily determined by the subsequent thermal cycles performed after the first implantation step. This arrangement has a number of disadvantages, including an increased source-to-drain series resistance and inherent structural degradations attributable to the oxide spacer 20 and an insufficient overlapped length $X_{ov}$.

FIG. 1B illustrates an alternative configuration of a portion of a MOSFET 30 in which the spacer 20 is eliminated and the gate 16 fully overlaps the N- LDD region 32. This configuration is referred to as a fully-overlapped LDD structure and the overlapped length $X_{ov}$ corresponds to the length of the LDD region 32. A first impurity implantation step is performed after the formation of the gate 16 and results in the N- LDD region 32. The drain region 32 implanted during the first implantation step is typically defined using a modified gate shape or a slant impurity implantation. A second implantation step is performed self-aligned to the gate 16 and increases the impurity concentration of the region 14 while the region 32 remains relatively lightly doped due to the presence of the gate 16. The fully-overlapped structure of FIG. 1B was developed in response to the above-noted problems with conventional partially-overlapped LDD structures in which the LDD region was defined in part by sidewall spacer 20.

A number of processes are known in the art for forming fully-overlapped LDD structures. Exemplary prior art processes are described in T. Y. Huang et al., "A New LDD Transistor with Inverse-T (ITLDD) Gate Structure," IEEE Electron Device Letters, Vol. EDL-8, No. 4, pp. 151–153, April 1987; R. Izawa et al., "Impact of the Gate-Drain Overlapped Device (GOLD) for Deep Submicron VLSI," IEEE Transactions on Electron Devices, Vol. 35, No. 12, pp. 2088–2093, December 1988; T. Hori, "¼ μm LATID (Large-Tilt-angle Implanted Drain) Technology for 3.3-V Operation," IEEE IEDM 1989, pp. 777–780; J. E. Moon et al., "A New LDD Structure: Total Overlap with Polysilicon Spacer (TOPS)," IEEE Electron Device Letters, Vol. 11, No. 5, pp. 221–223, May 1990; and D. S. Wen et al., "A Self-Aligned lnverse-T Gate Fully Overlapped LDD (FOLD) Device for Sub-Half Micron CMOS," IEEE IEDM 1989, pp. 765–768; all of which are incorporated by reference herein. The prior art ITLDD, GOLD, LATID, TOPS and FOLD processes each can provide a MOSFET device having a relatively high current driving power, a low maximum drain electric field and a relatively small hot carrier induced performance degradation. Unfortunately, these processes with the exception of the LATID process generally require a modification in the shape of the gate and a more complex manufacturing process, and therefore may be impractical to utilize in many important applications.

A relatively simple partially-overlapped LDD structure with a sufficient overlapped length $X_{ov}$ would be a preferable structure in numerous practical applications. However, the conventional processes described above fail to provide an effective technique for controlling the gate/drain overlapped length in partially-overlapped LDD structures. For example, utilizing a thermal cycle drive-in impurity implantation approach with certain of these prior art processes may result in an undesirable increase in junction depth, while utilizing a slant impurity implantation approach with other prior art processes may lead to difficulty in controlling the effective channel length.

As is apparent from the above, a need exists for a process for forming either partially-overlapped or fully-overlapped LDD structures which provides improved control of gate/drain overlapped length and thereby avoids the above-noted problems of the prior art.

SUMMARY OF THE INVENTION

The present invention provides a process for forming a lightly-doped drain (LDD) structure in a MOSFET or other semiconductor device. The process in one embodiment utilizes two polysilicon layer etching steps to control the resulting gate/drain overlapped length for both partially-overlapped and fully-overlapped LDD structures.

In accordance with one embodiment of the invention, a method is provided for forming an LDD structure. A first polysilicon layer is deposited on a semiconductor substrate over a thin gate oxide layer. The first polysilicon layer is etched to form a first polysilicon gate region having a first length and overlying a first portion of the substrate. A portion of the substrate adjacent the first gate region is doped to form therein a drain region having a relatively low impurity concentration. The first gate region is then removed by wet etching and a second layer of polysilicon is deposited over the substrate. The second polysilicon layer is etched to define a second gate region having a second length longer than the first length and which will serve as the gate for the MOSFET device. The drain region is then subjected to a second doping operation to thereby produce an LDD structure which includes an LDD region having a relatively low concentration and at least a portion thereof underlying the second gate region, and a more heavily-doped region having a second impurity concentration greater than the first impurity concentration.

The invention may be utilized to form a partially-overlapped LDD structure by including the additional steps of depositing an oxide layer and etching back the oxide layer to form a sidewall spacer adjacent the second gate region.

BRIEF DESCRIPTION OF THE DRAWINGS

FIG. 2 illustrates an exemplary set of processing steps for forming an LDD structure in accordance with the present invention.

DETAILED DESCRIPTION OF THE INVENTION

Figure 1A:
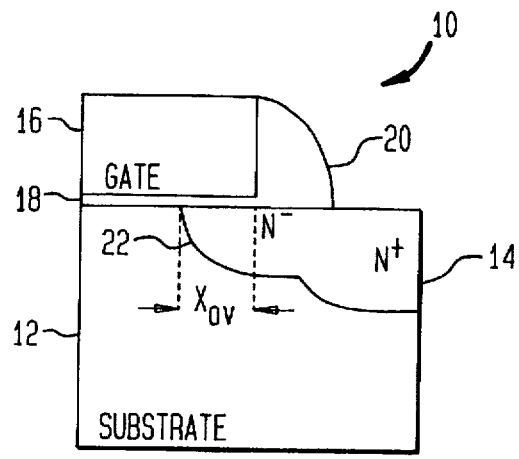
FIG. 1A shows a portion of a metal-oxide-semiconductor (MOS) field effect transistor (FET) including a partially-overlapped lightly-doped drain (LDD) structure in accordance with the prior art.
Figure 1B:
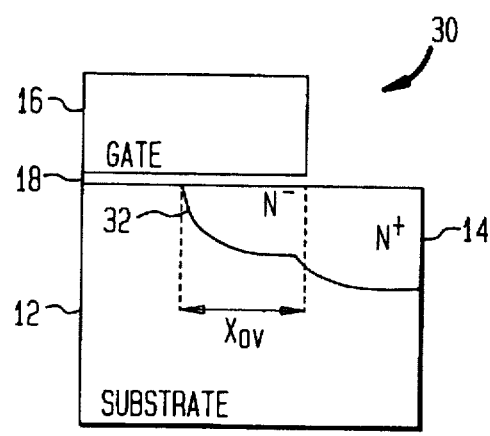
FIG. 1B shows a portion of a MOSFET including a fully-overlapped LDD structure in accordance with the prior art.

FIG. 2 illustrates steps (1) through (9) in the formation of a lightly-doped drain (LDD) structure in accordance with an exemplary embodiment of the invention. Although the process is illustrated in the context of forming a partially-overlapped LDD structure, it will be apparent from the description that the invention can also be used to form fully-overlapped LDD structures. It should also be noted that the invention may be used to form other alternative LDD structures including, for example, silicon-on-insulator (SOI) MOSFETs and thin-film transistors (TFTs). Furthermore, the device dimensions, materials, thicknesses and other illustrative features set forth in the following description should not be construed as limiting the invention to any particular application or group of applications.

The process steps (1) through (9) illustrated in FIG. 2 include simplified views of an exemplary MOSFET structure for purposes of clarity. In step (1), a gate oxide layer 52 is formed on a P-type semiconductor substrate in a conventional manner to a thickness of about 60 to 130 Å using a wet or dry oxidation process. A first layer of polysilicon 50 is then deposited on the gate oxide layer 52 to a thickness of about 2500 to 3500 Å using a conventional chemical vapor deposition (CVD) process.

Alternatives to the first layer of polysilicon 50 include $Si_3N_4$ and $SiO_2$.

In step (2), a first layer of photoresist is applied to the upper surface of the first polysilicon layer 50 and the layer 50 is etched in accordance with the pattern of the first photoresist layer to form a first polysilicon gate region 54. The first photoresist layer pattern thus defines the length of the first gate region 54, which may be on the order of about 0.2 to 0.9 µm.

In step (3), an N- LDD region is formed using a conventional phosphorous implantation process. The first gate region 54 formed in step (2) serves to effectively mask off a portion of the substrate to prevent that portion from being implanted with impurities during this first implantation step. The implantation produces a drain region 56 having an impurity concentration of about $3\times10^{17} cm^{-3}$ to $1\times10^{19} cm^{-3}$. Other suitable dopants, such as arsenic, could be used in place of phosphorous.

In step (4), the first polysilicon gate region 54 is removed using wet etching or another suitable technique such as dry etching.

In step (5), a second layer of polysilicon 58 is deposited on the gate oxide layer 52 to a thickness of about 2500 to 3500 Å using a conventional CVD process. The second polysilicon layer 58 covers the gate oxide layer 52 and the drain region 56.

In step (6), a second layer of photoresist is applied to the upper surface of the second polysilicon layer 58 and the layer 58 is then etched in accordance with the pattern of the second layer of photoresist to form a second polysilicon gate region 59. The second photoresist layer pattern thus defines the length of the second gate region 59, which may be on the order of 0.2 to 1.0 µm. The gate/drain overlapped length $X_{ov}$ in this exemplary embodiment is therefore on the order of 0.0 to 0.1 µm. Of course, other amounts of overlap could be used in other embodiments. The present invention permits the overlapped length $X_{ov}$ to be accurately determined by appropriate selection of the pattern dimensions for the first and second photoresist layers.

In step (7), a layer of undoped tetraethylorthosilicate (TEOS) 60 is deposited over the gate region 58 and gate oxide 52 to a thickness of about 800 to 2500 Å using a conventional low temperature oxide deposition process. Other materials, such as $Si_3N_4$, could be used in place of TEOS.

In step (8), an oxide spacer 61 is formed by dry etching of the TEOS layer 60, and a second impurity implantation is then performed using an arsenic dopant with conventional active and drive-in implantation processes. The second implantation forms an N+ region 66 which has an impurity concentration on the order of $5\times10^{19} cm^{-3}$ to $1\times10^{21} cm^{-3}$. Other impurities, such as antimony, could be used in place of arsenic. The oxide spacer 61 prevents the implantation of the portion of drain region 56 underlying the spacer 61, resulting in maintenance of a relatively lightly doped N- LDD region 64 under the spacer 61 and gate region 58. Rapid thermal process (RTP) annealing may be performed after completion of the second implantation.

In step (9), a TEOS-based layer 62 of borophosphosilicate glass (BPSG) is deposited over the gate region 58, spacer 61 and gate oxide 52 to a thickness on the order of 2500 Å using a chemical vapor deposition (CVD) process. The layer 62 serves to planarize the resulting MOS device to facilitate subsequent processing steps.

Steps (1) through (9) of FIG. 2 as described above illustrate the formation of a partially-overlapped LDD structure using a sidewall spacer 61. A fully-overlapped structure may be obtained by omitting step (7) and the spacer formation portion of step (8), and adjusting the pattern dimensions of the first and second photoresist layers to provide the desired dimensions of the first and second gate regions 54, 58 and thereby the desired gate/drain overlapped length. It should be noted that the polysilicon gate regions 54 and 58 may be formed of other types of materials, including metals such as aluminum.

The present invention provides a process for accurately and efficiently controlling gate/drain overlapped length in an LDD structure using first and second polysilicon gate regions defined by first and second photoresist layers, respectively. In contrast, the above-described prior art processes generally utilize oxide spacer width arid thermal cycles to define the length of a lightly doped drain region, and therefore are unable to control adequately the gate/drain overlapped length.

The above-described embodiments of the invention are intended to be illustrative only. Numerous other embodiments of the invention falling within the scope of the appended claims will be apparent to those of ordinary skill in the art.

The claimed invention is:

1. A process for forming a semiconductor device having a substrate, the process including the steps of:

(a) depositing a first layer of polysilicon on the substrate;

(b) etching the first polysilicon layer to define with precision a first polysilicon gate region having a first length and overlying a first portion of the substrate;

(c) doping a portion of the substrate adjacent the gate region to form therein a drain region of a first conductivity type and a first impurity concentration;

(d) removing at least a portion of the first polysilicon gate region;

(e) depositing a second layer of polysilicon on the substrate;

(f) etching the second polysilicon layer to define with precision a second gate region having a second length longer than the first length and overlying a second portion of the substrate which includes a substantial part of the first portion of the substrate; and (g) doping a portion of the drain region adjacent the second gate region such that the drain region includes a lightly-doped region having substantially the first impurity concentration, at least a portion of the lightly-doped region underlying a portion of the second gate region, and a more heavily-doped region having a second impurity concentration greater than the first impurity concentration.

2. The process of claim 1 wherein a gate oxide layer is formed on the substrate and the first and second polysilicon layers deposited in steps (a) and (e) are deposited over the gate oxide layer.

3. The process of claim 1 further including the steps of:

(h) depositing an oxide layer over the etched second polysilicon layer; and (i) etching the oxide layer to form an oxide spacer adjacent the second gate region defined by the etched second polysilicon layer.

4. The process of claim 1 further including the step of depositing a layer of borophosphosilicate glass (BPSG) over the second gate region and the drain region.

5. The process of claim 1 wherein the first doping step (c) further includes doping the substrate with an N-type impurity in a concentration of about $3\times10^{17}\text{cm}^{-3}$ to $1\times10^{19}\text{cm}^{-3}$.

6. The process of claim 1 wherein the second doping step (g) further includes doping the substrate with an N-type impurity in a concentration of about $5\times10^{19}\text{cm}^{-3}$ to $1\times10^{21}\text{cm}^{-3}$.

7. The process of claim 1 wherein the resulting lightly-doped region is fully overlapped by the second gate region.

8. The process of claim 1 wherein the resulting lightly-doped region is partially overlapped by the second gate region.

9. A process for forming a semiconductor device having a substrate and an oxide layer formed on the substrate, the method including the steps of:

etching a first layer of gate material deposited on the substrate to form with precision a first gate region having a first length;

doping a portion of the substrate adjacent the first gate region to form a drain region;

etching a second layer of gate material deposited on the substrate after removal of the first gate region to form with precision a second gate region having a second length longer than the first length; and doping a portion of the drain region adjacent the second gate region such that the drain region includes a lightly-doped region having at least a portion thereof underlying the second gate region, and a more heavily-doped region.

10. The process of claim 9 wherein a gate oxide layer is formed on the substrate and the first and second layers of gate material are deposited over the gate oxide layer.

11. The process of claim 9 further including the steps of:

depositing an oxide layer over the etched second layer; and etching the oxide layer to form an oxide spacer adjacent the second gate region defined by the etched second layer.

12. The process of claim 9 further including the step of depositing a layer of borophosphosilicate glass (BPSG) over the second gate region and the drain region.

13. The process of claim 9 wherein the first doping step further includes doping the substrate with an N-type impurity in a concentration of about $3\times10^{17}\text{cm}^{-3}$ to $1\times10^{19}\text{cm}^{-3}$.

14. The process of claim 9 wherein the second doping step further includes doping the substrate with an N-type impurity in a concentration of about $5\times10^{19}\text{cm}^{-3}$ to $1\times10^{21}\text{cm}^{-3}$.

15. The process of claim 9 wherein the resulting lightly-doped region is fully overlapped by the second gate region.

16. The process of claim 9 wherein the resulting lightly-doped region is partially overlapped by the second gate region.

* * * * *